United States Patent
Deng

(10) Patent No.: US 11,215,728 B2
(45) Date of Patent: Jan. 4, 2022

(54) FOLDABLE METAL DETECTOR

(71) Applicant: SHENZHEN CHECKPOINT SECURITY ELECTRONICS CO., LTD., Shenzhen (CN)

(72) Inventor: Maoquan Deng, Shenzhen (CN)

(73) Assignee: SHENZHEN CHECKPOINT SECURITY ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 17/110,263

(22) Filed: Dec. 2, 2020

(65) Prior Publication Data

US 2021/0116597 A1 Apr. 22, 2021

Related U.S. Application Data

(63) Continuation of application No. PCT/CN2019/111696, filed on Oct. 17, 2019.

(51) Int. Cl.
*G01V 3/17* (2006.01)
*G01V 3/10* (2006.01)
(Continued)

(52) U.S. Cl.
CPC ............ *G01V 3/17* (2013.01); *F16M 11/046* (2013.01); *G01R 33/0047* (2013.01);
(Continued)

(58) Field of Classification Search
CPC .......... G01V 3/10; G01V 3/101; G01V 3/102; G01V 3/104; G01V 3/15; G01V 3/165; G01V 3/17
See application file for complete search history.

(56) References Cited

U.S. PATENT DOCUMENTS 3,662,255 A * 5/1972 Garrett ................ G01V 3/15
324/328
9,851,466 B2 * 12/2017 Weaver ................ G01V 3/17
(Continued)

FOREIGN PATENT DOCUMENTS

CN 202904040 U 4/2013
CN 205665415 U 10/2016
(Continued)

OTHER PUBLICATIONS

English machine translation of the description of CN206248846U, obtained from the EPO website https://worldwide.espacenet.com/advancedSearch?locale=en_ep, obtained on Feb. 13, 2021 (Year: 2021).*

(Continued)

*Primary Examiner* — Jermele M Hollington
(74) *Attorney, Agent, or Firm* — Analects Legal LLC

(57) ABSTRACT

A foldable metal detector includes a detection coil disk, a waterproof circuit protecting chamber, a circuit component fixedly disposed in the waterproof circuit protecting chamber, folding fixing components, fastening components, an extending rod fixedly connected to a tail end of the waterproof circuit protecting chamber, and a BLUETOOTH remote control component configured to control the foldable metal detector. The extending rod is manually detachable from the waterproof circuit protecting chamber. The circuit component is electrically connected with the detection coil disk. Brackets are disposed on the detection coil disk. Each bracket includes a first through hole and a second through hole. The fastening components include bolts and fixing columns. Connecting heads with connecting holes are disposed on the waterproof circuit protecting chamber. Each bolt passes through each connecting hole and each first (Continued)

through hole. The bolts are movably connected to the folding fixing components.

9 Claims, 9 Drawing Sheets

(51) Int. Cl.
    *G01R 33/00*     (2006.01)
    *F16M 11/04*     (2006.01)
    *G01V 3/15*     (2006.01)
    *H01R 13/52*     (2006.01)

(52) U.S. Cl.
    CPC .............. *G01V 3/104* (2013.01); *G01V 3/15* (2013.01); *H01R 13/5213* (2013.01)

(56) References Cited

U.S. PATENT DOCUMENTS

| | | | | |
|---|---|---|---|---|
| 10,809,411 | B2* | 10/2020 | Deng | H04W 4/029 |
| 2004/0000918 | A1* | 1/2004 | Sanoner | G01V 3/088 |
| | | | | 324/671 |
| 2006/0091888 | A1* | 5/2006 | Holman | G01V 3/15 |
| | | | | 324/326 |
| 2013/0082865 | A1 | 4/2013 | Duvoisin, III et al. | |
| 2016/0091629 | A1* | 3/2016 | Deng | G01V 3/10 |
| | | | | 324/329 |
| 2017/0299756 | A1* | 10/2017 | Weaver | G01V 3/165 |
| 2018/0252835 | A1* | 9/2018 | Deng | G01V 3/165 |
| 2018/0335540 | A1* | 11/2018 | Loubet | G01V 3/15 |
| 2020/0213434 | A1* | 7/2020 | Samkov | G01V 3/10 |
| 2020/0341164 | A1* | 10/2020 | Blankenship | H04W 4/00 |
| 2021/0116595 | A1* | 4/2021 | Deng | G01R 33/0047 |

FOREIGN PATENT DOCUMENTS

| | | |
|---|---|---|
| CN | 206248846 U | 6/2017 |
| CN | 206684322 U | 11/2017 |
| CN | 207263940 U | 4/2018 |
| CN | 208044093 U | 11/2018 |
| CN | 208721807 U | 4/2019 |
| DE | 29617214 U1 | 11/1996 |

OTHER PUBLICATIONS

International Search Report for PCT/CN2019/111696, dated Jul. 15, 2020.
Written Opinion of the International Search Authority for PCT/CN2019/111696, dated Jul. 15, 2020.

\* cited by examiner

FOLDABLE METAL DETECTOR

CROSS-REFERENCE TO RELATED APPLICATION

The present disclosure claims foreign priority to International (PCT) Patent Application No. PCT/CN2019/111696, titled: PORTABLE FOLDABLE METAL DETECTOR, filed on Oct. 17, 2019, and the entire contents of which is hereby incorporated by reference.

TECHNICAL FIELD

The present disclosure relates to a field of metal detection technology, and in particular to a foldable metal detector.

BACKGROUND

At present, in a field of metal detection, metal detection devices are commonly used detection tools. There are three main types of metal detectors: electromagnetic induction metal detectors, X-ray detection metal detectors, and microwave detection metal detectors. The metal detectors are electronic instruments configured to detect metals and are used in many fields: In a field of military, the metal detector is configured to detect metal mines. In a field of security, the metal detector is configured to detect weapons or crime tools that are carried by those dangerous. In a field of archaeology, the metal detector is configured to detect ancient tombs with buried metal objects, such as gold and silver treasures, jewelry, or other metal products in the ancient tombs. In a field of engineering, the metal detector is configured to detect buried underground metal objects, such as pipelines, wires, etc. In a field of mineral exploration, the metal detector is configured to detect natural gold particles. In industry, the metal detector is configured for online monitoring, such as removing metal impurities in cotton, coal, food, etc.

A detection coil disk of a conventional handheld metal detector on the market is fixed at a fixed angle and unable to adjust an angle of the detection coil disk. When using the handheld metal detector to detect the ground, a user needs to lean down. Moreover, most of handheld metal detectors are unable to be used as standing-use metal detectors. Although there are also some handheld detectors that are able to be used as standing-use metal detectors, a structure of these handheld metal detectors is complicated, a size is large, and it is not convenient to store and carry these handheld metal detectors. A rotating shaft of the conventional handheld metal detector with a rotatable detection coil disk is generally a through bolt. Although this type of the handheld metal detector is low in cost, a signal transmission wire of the handheld metal detector is unable to be disposed in a middle of the handheld metal detector and is disposed on an outer side of the rotating shaft. Since the signal transmission wire is disposed outside, it is prone to damage due to bumps. In summary, the detection coil disks of the conventional detection metal detectors are divided into several types. One type of the detection coil disks is not foldable and have a fixed angle, which are inconvenient to carry and use. Another type of the detection coil disks is foldable but the signal transmission wire thereof is exposed and is easily damaged. Another type of the detection coil disks is foldable, but the signal transmission wire thereof is far away from a main control detection module, which affects distortion rate of the signal. Another type of the detection coil disks is foldable and have no cables, but the structure is complex and the volume is large. These mainstream metal detectors still have problems such as difficult replacement operations and easy cable damage when replacing the detection coil disk.

SUMMARY

In order to solve the above problems, the present disclosure proposes a foldable portable metal detector where a detection coil disk is easily and quickly replaced. Further, the foldable metal detector is convenient to fold and carry, and is used as both a handheld metal detector and a standing-use metal detector.

The present disclosure provides a foldable metal detector. The foldable metal detector comprises a detection coil disk, a waterproof circuit protecting chamber, a circuit component, folding fixing components, fastening components, an extending rod, and a BLUETOOTH remote control component. The BLUETOOTH remote control component is configured to control the foldable metal detector. The circuit component is fixedly disposed in the waterproof circuit protecting chamber. The circuit component is withdrawnable from the waterproof circuit protecting chamber The extending rod is fixedly connected to a tail end of the waterproof circuit protecting chamber. The extending rod is manually detachable from the waterproof circuit protecting chamber. The circuit component is electrically connected with the detection coil disk. Brackets are disposed on the detection coil disk. Each of the brackets comprises a first through hole and a second through hole. The fastening components comprise bolts and fixing columns. Connecting heads are disposed on the waterproof circuit protecting chamber. Connecting holes are on the connecting heads. Each bolt passes through each connecting hole and each first through hole in sequence. The bolts are movably connected to the folding fixing components. Each fixing column passes through each second through hole. The waterproof circuit protecting chamber rotates with the bolts as a rotation axis.

Furthermore, first threads are on the bolts, second threads are on the folding fixing components. The first threads are screwed with the second threads. Trough cooperation of the first threads and the second threads, a rotating position of the waterproof circuit protecting chamber is determined by rotating the folding fixing components.

Furthermore, the foldable metal detector further comprises a tail cover. Third threads are on the tail cover. The tail cover is fixedly connected to the tail end of the waterproof circuit protecting chamber through the third threads.

Furthermore, the tail cover comprises a connecting nut. The extending rod comprises a stud. The connecting nut is fixedly disposed in the tail cover. The stud is screwed into the connecting nut, so that the extending rod is fixedly connected with the waterproof circuit protecting chamber.

Furthermore, the circuit component comprises a connecting wire, an audio socket connector, and a circuit board. A BLUETOOTH module is disposed on the circuit board. The BLUETOOTH module is fixedly installed on the circuit board and is electrically connected with the circuit board. One end of the connecting wire is electrically connected with the detection coil disk. Another end of the connecting wire is an audio plug connector. The audio socket connector is disposed on the circuit board and is electrically connected with the circuit board. The audio plug connector is insertable into or separable from the audio socket connector.

Furthermore, the circuit component further comprises a mounting board. The circuit board is fixedly disposed on the mounting board.

Furthermore, the circuit component further comprises an upper shell and a fixing shell. The fixing shell is fixedly connected with the upper shell and the mounting board.

Furthermore, the circuit component further comprises buttons. The buttons pass through the upper shell and are electrically connected with the circuit board.

Furthermore, button caps are disposed on the waterproof circuit protecting chamber. Pressing sheets are disposed on the waterproof circuit protecting chamber. When the circuit component is fixedly disposed in the waterproof circuit protecting chamber, inner surfaces of the pressing sheets are attached to the buttons. The waterproof circuit protecting chamber wraps the circuit component. The button caps are attached to outer surfaces of the pressing sheets.

Furthermore, the circuit component further comprises a battery. The battery is electrically connected with the circuit board.

In the foldable metal detector of the present disclosure, the detection coil disk rotates with respect to the waterproof circuit protecting chamber so that the detection coil disk is foldable relative to the waterproof circuit protecting chamber, which saves transportation space when transporting the foldable metal detector and is convenient for a user to carry. When unfolded, the foldable metal detector has a longer length than similar products on the market, and is more suitable for quick large-area scanning operations. Two sides of the connecting head of the waterproof circuit protecting chamber are connected with a respective folding fixing component, which fastens the connecting heads. The bolts are assembled from inner sides of the bracket on the detection coil disk to an outside, and the folding fixing components are screwed with the bolt at outer sides of the bracket, which leaves enough space for a cable to rotate in an axial direction, avoids wear of the cable during a rotation of the waterproof circuit protecting chamber, and prevents the folding fixing components from falling off the bolts due to relative movement of the waterproof circuit protecting chamber and the detection coil disk.

The audio socket connector is configured to electrically connected the detection coil disk with the circuit component, which realizes a rapid replacement of the detection coil disk. The tail cover is disposed at the end of the waterproof circuit protecting chamber, and the extending rod is connected with the tail cover, so that the foldable metal detector is able to convert from a handheld metal detector to a standing-use metal detector. The circuit component is equipped with the BLUETOOTH module. The BLUETOOTH module is connectable to a BLUETOOTH switch to turn on, turn off, or set function of the foldable metal detector.

DETAILED DESCRIPTION

In order to describe technical solutions of the present disclosure clearly and completely, the present disclosure will be further described below with reference to the accompanying drawings.

Figure 1:
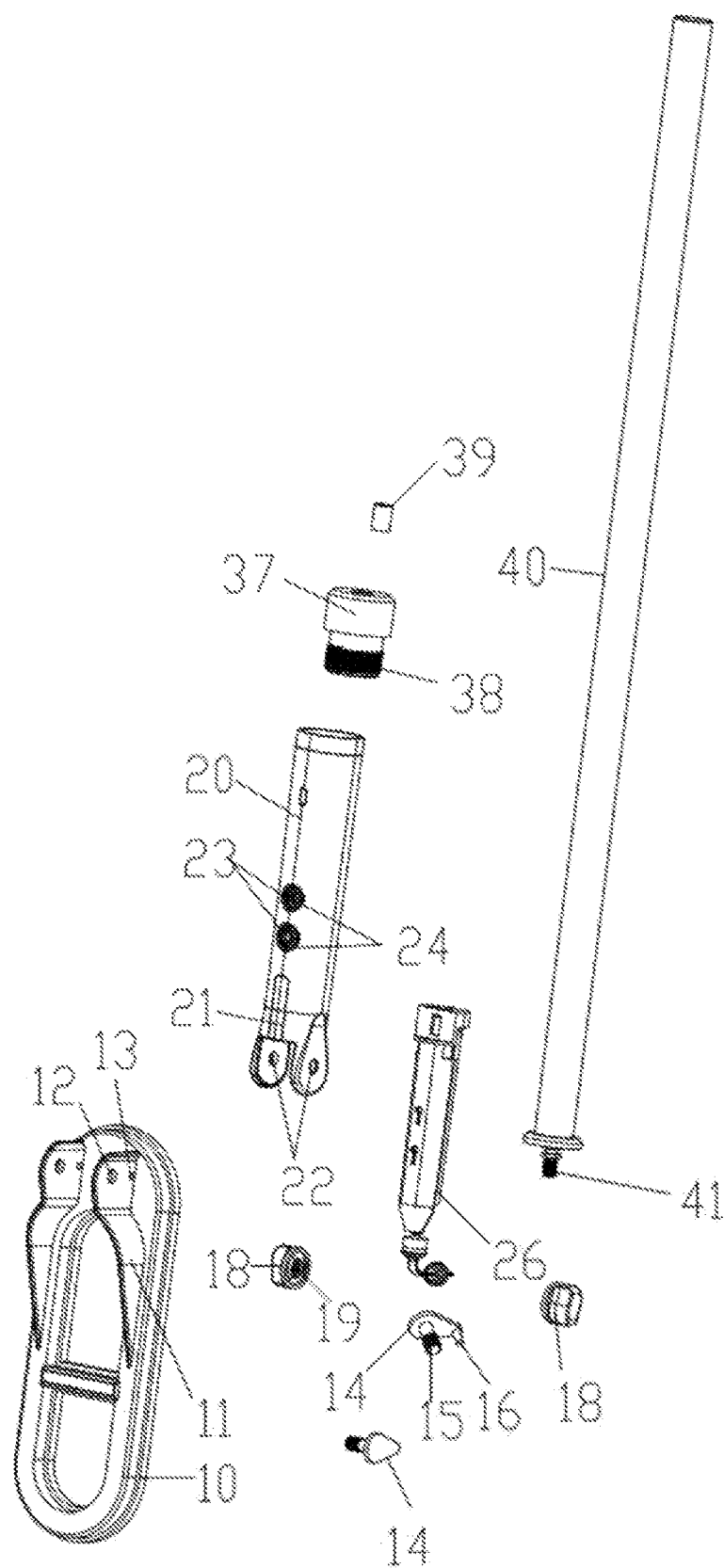
FIG. 1 is an exploded view of a foldable metal detector of the present disclosure.
Figure 2:
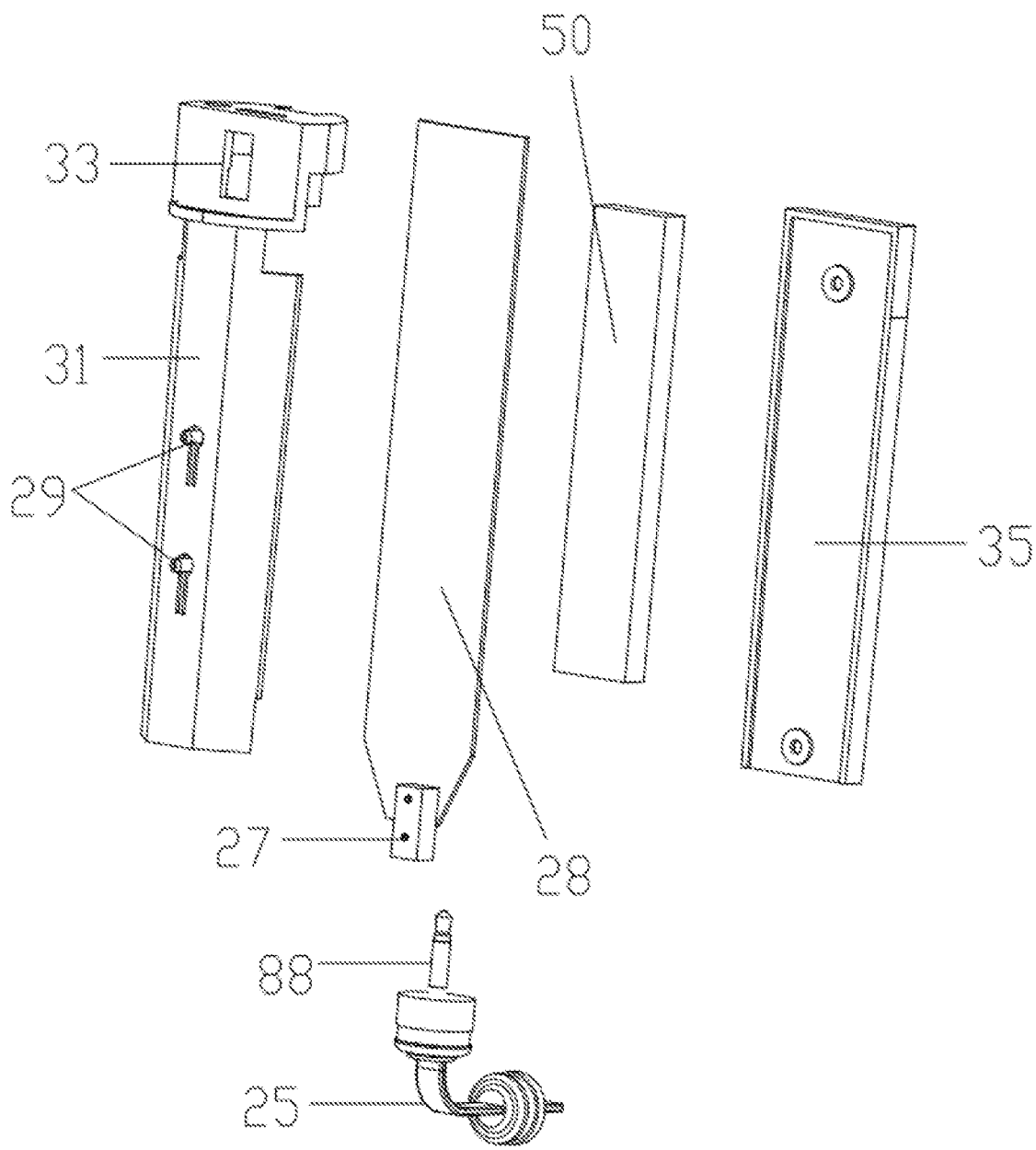
FIG. 2 is an exploded view of a circuit component of the present disclosure.
Figure 3:
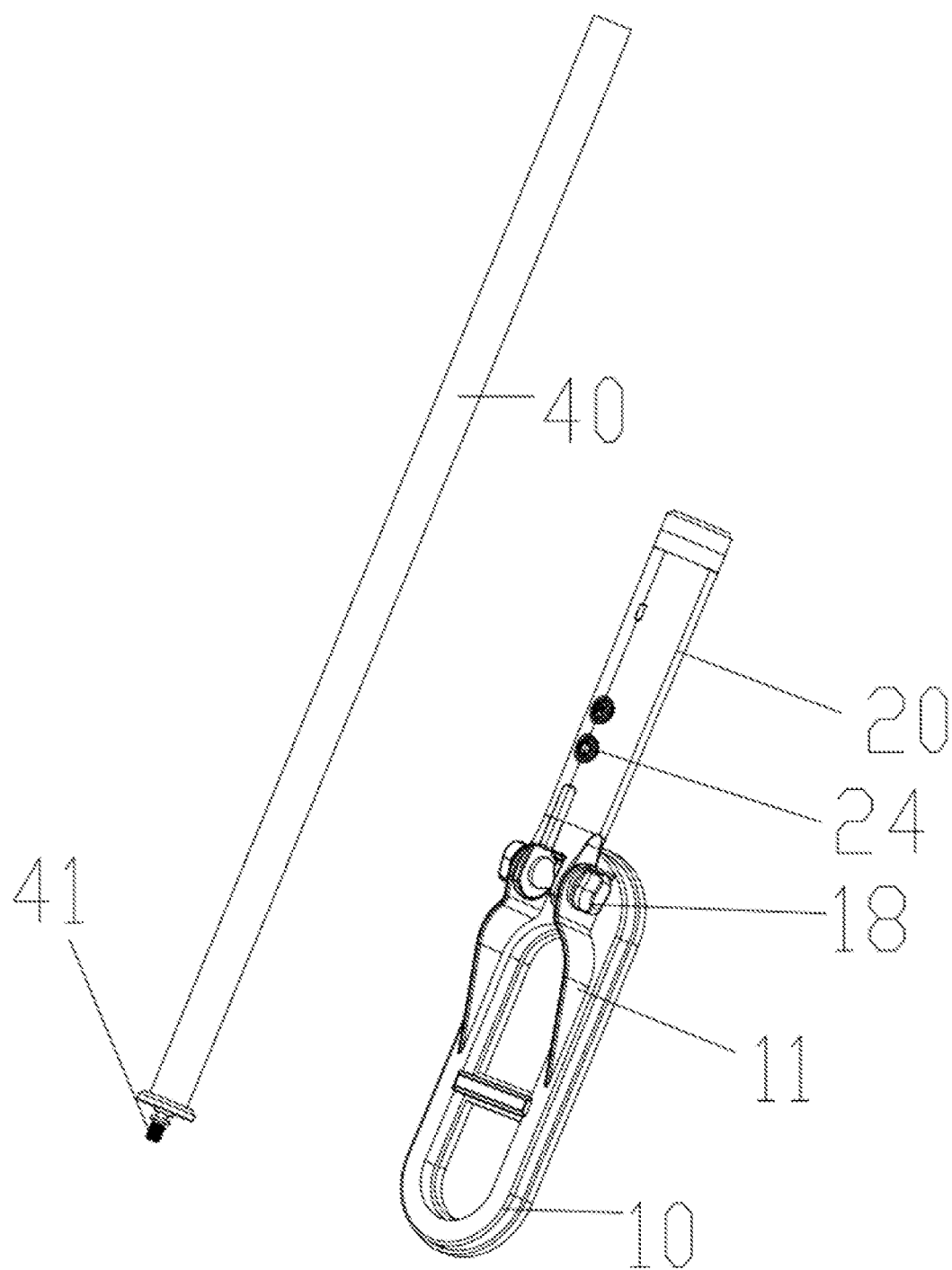
FIG. 3 is schematic diagram of the foldable metal detector of the present disclosure where the foldable metal detector is in a configuration of use.
Figure 4:
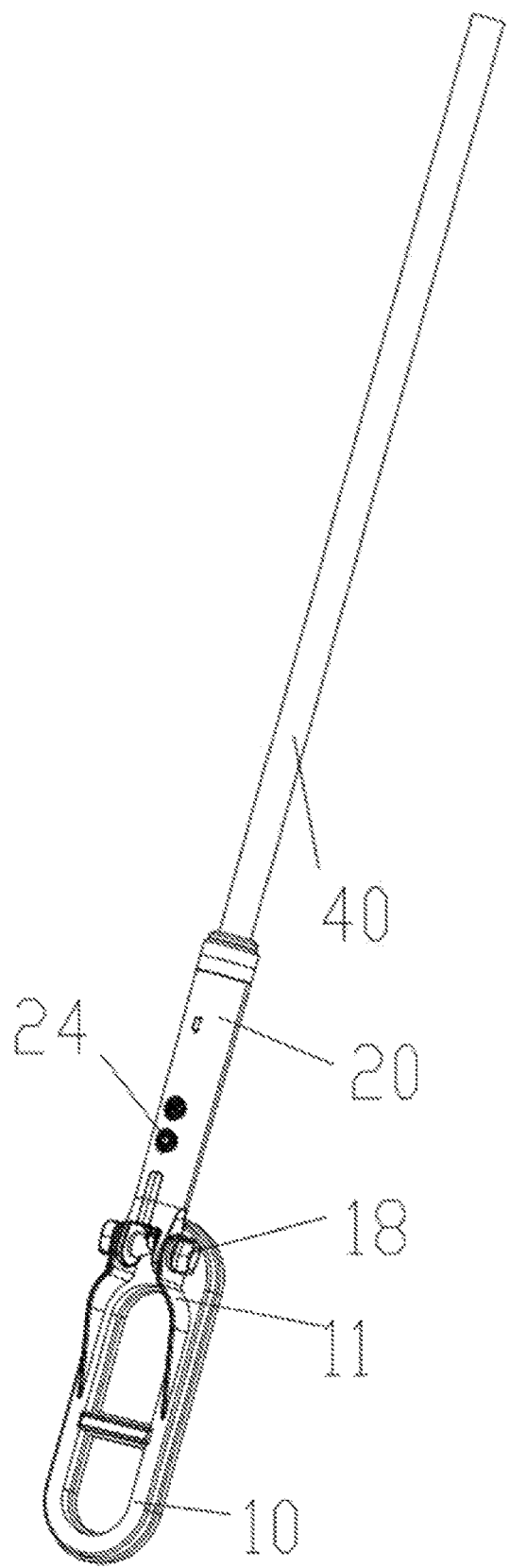
FIG. 4 is a schematic diagram showing a structure of the foldable metal detector of the present disclosure.
Figure 5:
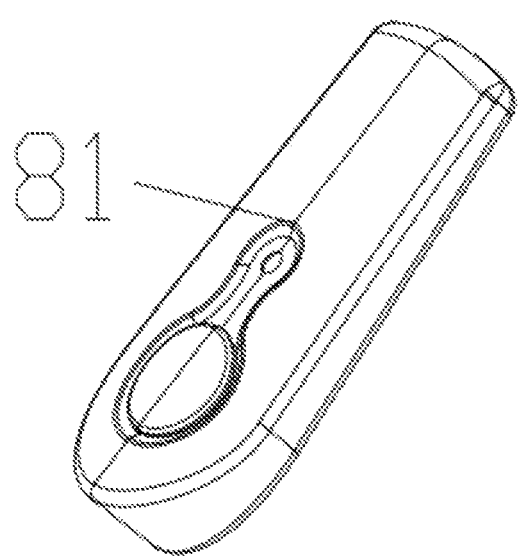
FIG. 5 is a schematic diagram showing at structure of a BLUETOOTH remote control component of the present disclosure.
Figure 6:
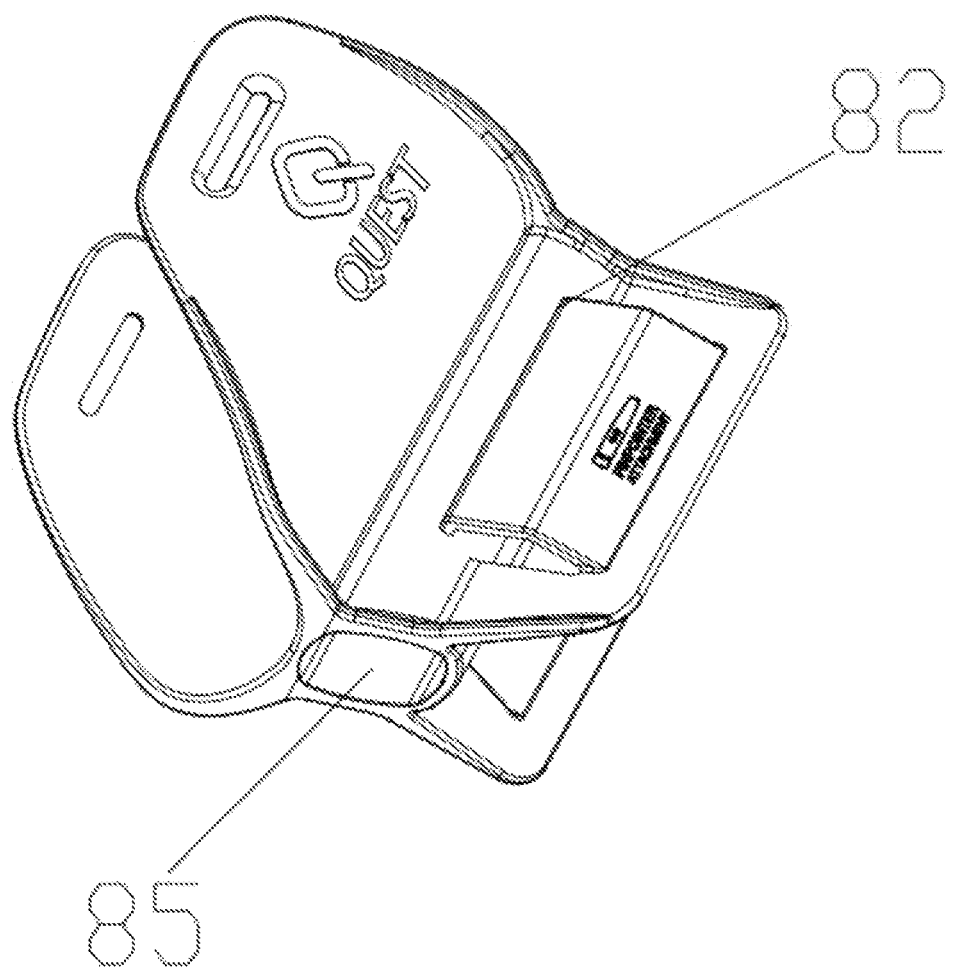
FIG. 6 is a schematic diagram showing a structure of an elbow pad of the present disclosure.
Figure 7:
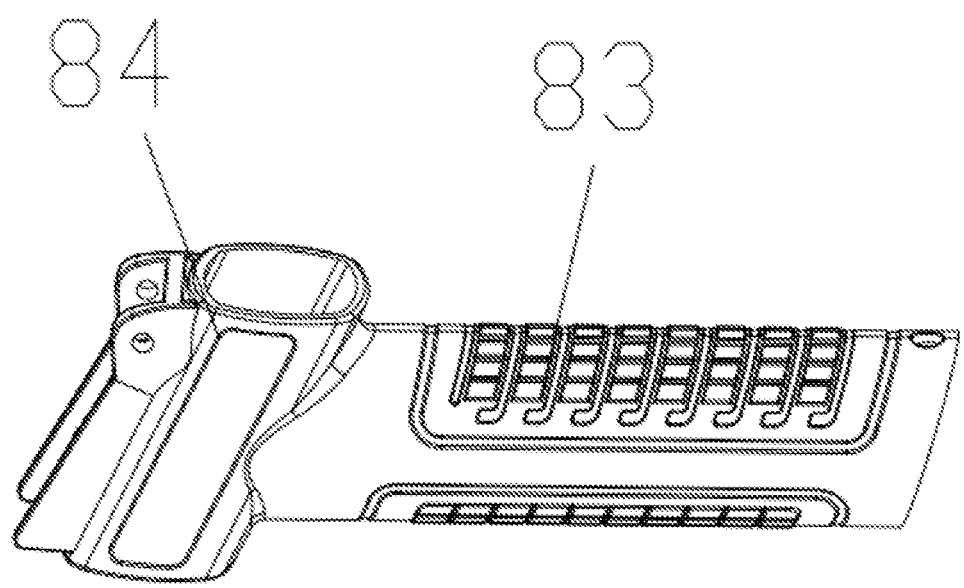
FIG. 7 is a schematic diagram showing a structure of a handle of the present disclosure.
Figure 8:
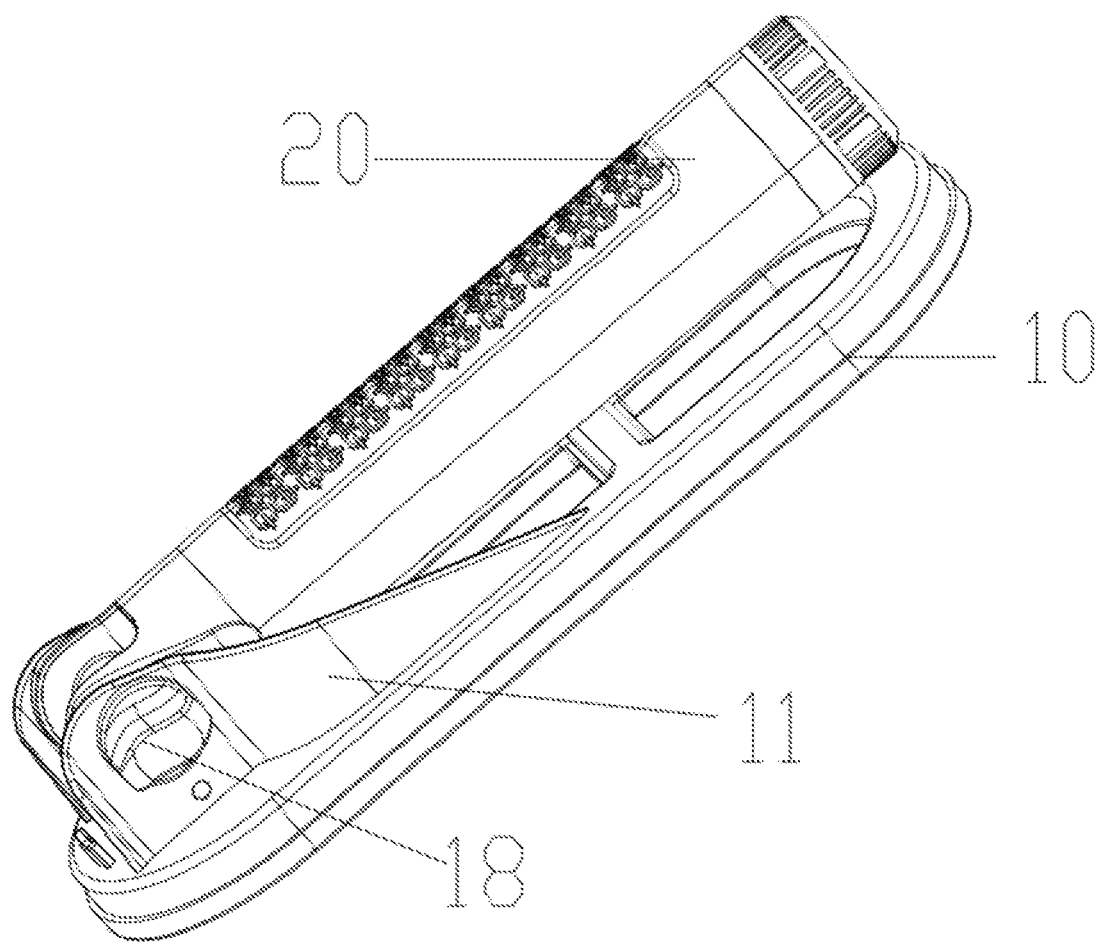
FIG. 8 is schematic diagram of the foldable metal detector of the present disclosure where the foldable metal detector is in a folded state.
Figure 9:
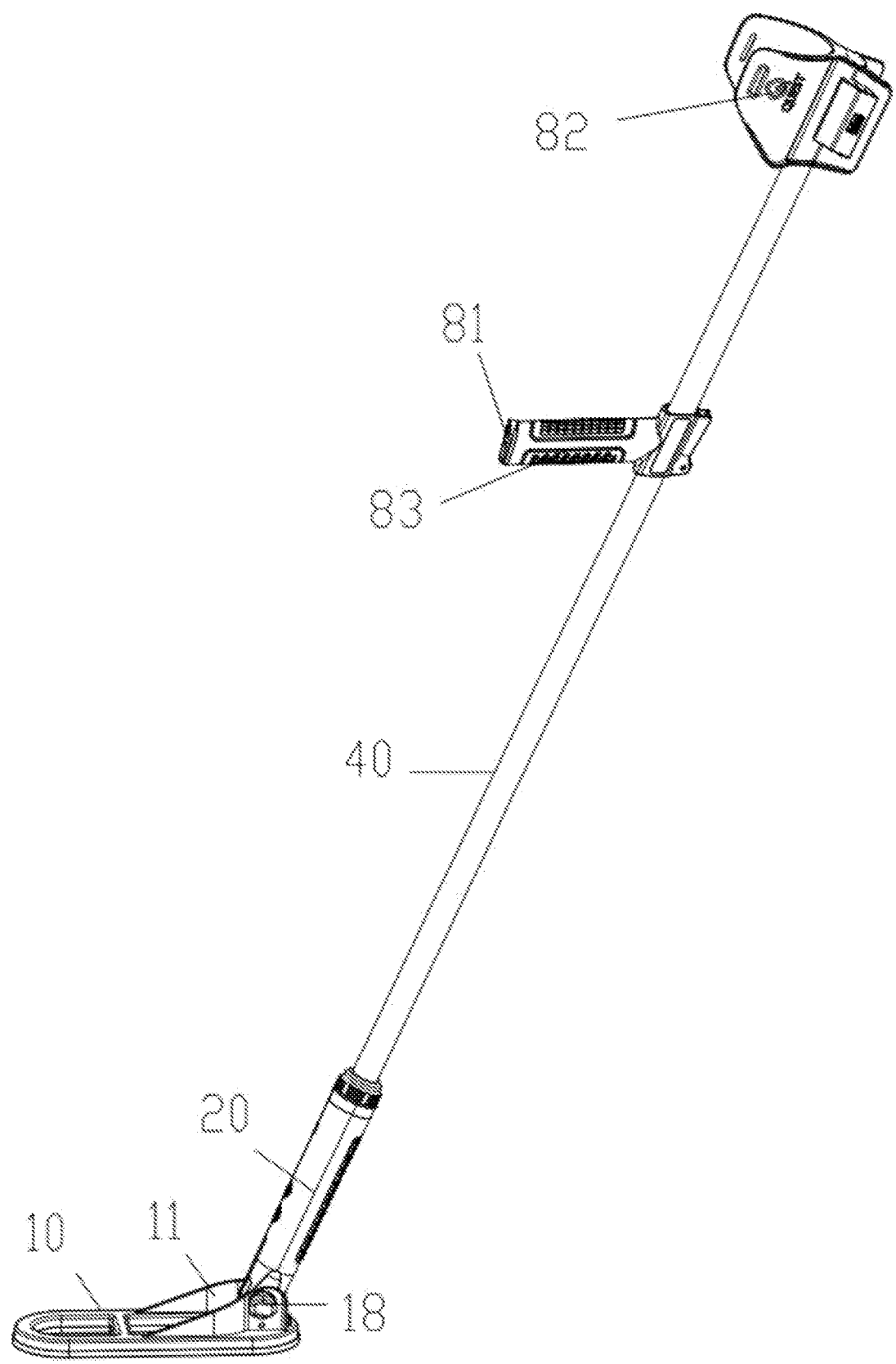
FIG. 9 is schematic diagram of the foldable metal detector of the present disclosure where the foldable metal detector is another configuration of use.

As shown in FIGS. 1-9, the present disclosure provides a foldable metal detector. The foldable metal detector comprises a detection coil disk 10, a waterproof circuit protecting chamber 20, a circuit component 26, folding fixing components 18, fastening components 14, an extending rod 40, and a BLUETOOTH remote control component 81. The BLUETOOTH remote control component 81 is configured to control the foldable metal detector. The circuit component 26 is fixedly disposed in the waterproof circuit protecting chamber 20. The extending rod 40 is fixedly connected to a tail end of the waterproof circuit protecting chamber 20. The extending rod 40 is manually detachable from the waterproof circuit protecting chamber 20. The circuit component 26 is electrically connected with the detection coil disk 10. Brackets 11 are disposed on the detection coil disk 10. Each of the brackets 11 comprises a first through hole 12 and a second through hole 13. The fastening components 14 comprise bolts 15 and fixing columns 16. Connecting heads 21 are disposed on the waterproof circuit protecting chamber 20. Connecting holes 22 are on the connecting heads 21. Each bolt 15 passes through each connecting hole 22 and each first through hole 12 in sequence. The bolts 15 are movably connected to the folding fixing components 18. Each fixing column 16 passes through each second through hole 13. The waterproof circuit protecting chamber 20 rotates with the fixing column 16 as a rotation axis. First threads are on the bolts 15 and second threads 19 are on the folding fixing components 18. The first threads are screwed with the second threads 19. Through cooperation of the first threads and the second threads 19. a rotating position of the waterproof circuit protecting chamber 20 is determined by rotating the folding fixing components 18.

In the embodiment, two bracket 11 are disposed on the detection coil disk 10. Each bracket 11 comprises one first through hole 12 and one second through hole 13. The connecting heads 21 are connecting plates on both sides of the waterproof circuit protecting chamber and have a hollow structure. The connecting plates 21 comprise the connecting holes 22. There are two fastening components 14 and the each fastening component 14 passes through the corresponding connecting hole 22 and the corresponding first through hole 12 from an inner inside of the corresponding bracket 11 to an outside. Then, each folding fixing component 18 is then screwed to each bolt 15.

The circuit component 26 is able to be quickly withdrawn from the waterproof circuit protecting chamber 20. Because the bolts 15 are externally threaded with the first threads, and the folding fixing components 18 are internally threaded with the second threads 19, so that the detection coil disk 10 and the waterproof circuit protecting chamber 20 are fixed in a predetermined relative position by rotating the folding fixing components 18, which also makes the foldable metal detector foldable and convenient to carry and store. The detection coil disk 10 is an elliptical disk, a detection coil is disposed in the detection coil disk 10. The circuit component 26 and the detection coil disk 10 are connected through a flexible cable to transmit detection signals. One end of the cable of the detection coil disk 10 is an audio plug. The audio plug is connected to the audio socket of the circuit component 26. The audio plug is connected with the circuit component 26 by inserting into the audio socket. The connection of the audio plug and the audio socket makes electrical connection between the circuit component 26 and the detection coil disk 10 convenient, and also facilitates a replacement of the detection coil disk with another detection coil disk. The foldable metal detector further comprises an elbow pad 82 and a handle 83. The handle 83 comprises a connecting tube 84. The connecting tube 84 is fixedly connected to the extending rod 40, so that the handle 83 is fixedly installed on the extending rod 40.

The BLUETOOTH remote control component 81 is installed on the handle 83. The BLUETOOTH remote control component 81 remotely wireless controls the foldable metal detector. The elbow pad 82 comprises a fixing tube 85 fixedly installed on a tail end of the extending rod 40. Installation of the elbow pad and the handle makes the foldable metal detector convenient to operate when the extending rod 40 is equipped.

In one embodiment, the foldable metal detector further comprises a tail cover 37. Third threads 38 are on the tail cover 37. The tail cover is 37 is fixedly connected to the tail end of the waterproof circuit protecting chamber 20 through the third threads 38. The tail cover 37 comprises a connecting nut 39. The extending rod 40 comprises a stud 41. The connecting nut 39 is fixedly disposed in the tail cover 37. The stud 41 is screwed into the connecting nut 39, so that the extending rod 40 is fixedly connected with the waterproof circuit protecting chamber 20.

In the embodiment, the extending rod 40 is screwed with the tail cover 37 through the stud 4, which is simple and convenient in connection and makes a speed of an installation of the extending rod 40 on the waterproof circuit protecting chamber 20 fast.

In one embodiment, the circuit component 26 comprises a connecting wire 25, an audio socket connector 27, and a circuit hoard 28. A BLUETOOTH module is disposed on the circuit board 28. The BLUETOOTH module is fixedly installed on the circuit board 28 and is electrically connected with the circuit board 28. One end of the connecting wire 25 is electrically connected with the detection coil disk 10. Another end of the connecting wire 25 is an audio plug connector 88. The audio socket connector 27 is disposed on the circuit board 28 and is electrically connected with the circuit board 28. The audio plug connector 88 is insertable into or separable from the audio socket connector 27.

In the embodiment, by setting the audio socket connector 27 and the audio plug connector 88, the circuit component 26 is removed from the detection coil disk 10 quickly so that another detection coil disk can be quickly replaced. A BLUETOOTH switch is disposed on the extending rod 40, and the BLUETOOTH switch is connected with the BLUETOOTH module, so that turning on and turning off of the foldable metal detector are controlled by the BLUETOOTH switch. When the foldable metal detector is equipped with the extending rod 40, a user is no need to bend down to press buttons 29 on the waterproof circuit protecting chamber 20.

In one embodiment, the circuit component 26 further comprises a mounting board 35. The circuit board 28 is fixedly disposed on the mounting board 35. The circuit component 26 further comprises an upper shell 31 and a fixing shell 33. The fixing shell 33 is fixedly connected with the upper shell 31 and the mounting board 35. The circuit component 26 further comprises buttons 29. The buttons 29 pass through the upper shell 31 and are electrically connected with the circuit board 28.

Furthermore, the foldable metal detector comprises the waterproof circuit protecting chamber 20. Button caps 24 are disposed on the waterproof circuit protecting chamber 20. Pressing sheets 23 are disposed on the waterproof circuit protecting chamber 20. When the circuit component 26 is fixedly disposed in the waterproof circuit protecting chamber 20, inner surfaces of the pressing sheets 23 are attached to the buttons 29. The waterproof circuit protecting chamber 20 wraps the circuit component 20. The button caps 24 are attached to outer surfaces of the pressing sheets 23. The circuit component 26 further comprises a battery 50. The battery 50 is electrically connected with the circuit board 28.

In the embodiment, by installation and cooperation between the upper shell 31, the mounting board 28, the fixing shell 33, the circuit board 28, and the battery 50, a structure of the entire circuit component 26 compact, reducing a space volume of the foldable metal detector.

Of course, the present disclosure also has many other embodiments. Based on the embodiments described, other embodiments can be obtained by those of ordinary skill in the art without any creative work, which shall fall within the protection scope of the present disclosure.

What is claimed is:

1. A foldable metal detector, comprising:
a detection coil disk;
a waterproof circuit protecting chamber;
a circuit component;
folding fixing components;
fastening components;
an extending rod; and
a BLUETOOTH® remote control component;
wherein the BLUETOOTH® remote control component is configured to control the foldable metal detector; the circuit component is fixedly disposed in the waterproof circuit protecting chamber; the circuit component is withdrawnable from the waterproof circuit protecting chamber; the extending rod is fixedly connected to a tail end of the waterproof circuit protecting chamber; the extending rod is manually detachable from the waterproof circuit protecting chamber; the circuit component is electrically connected with the detection coil disk; brackets are disposed on the detection coil disk; each of the brackets comprises a first through hole and a second through hole; the fastening components comprise bolts and fixing columns, connecting heads are disposed on the waterproof circuit protecting chamber; connecting holes are on the connecting heads; each bolt passes through each connecting hole and each first through hole in sequence, the bolts are movably connected to the folding fixing components; each fixing column passes through each second through hole; the waterproof circuit protecting chamber rotates with the bolts as a rotation axis, the circuit component comprises a connecting wire, an audio socket connector, and a circuit board; a BLUETOOTH® module is disposed on the circuit board; the BLUETOOTH® module is fixedly installed on the circuit board and is electrically connected with the circuit board; one end of the connecting wire is electrically connected with the detection coil disk; another end of the connecting wire is an audio plug connector, the audio socket connector is disposed on the circuit board and is electrically connected with the circuit board; the audio plug connector is insertable into or separable from the audio socket connector.

2. The foldable metal detector according to claim 1, wherein first threads are on the bolts; second threads are on the folding fixing components; the first threads are connected with the second threads; through cooperation of the first threads and the second threads, a rotating position of the waterproof circuit protecting chamber is determined by rotating the folding fixing components.

3. The foldable metal detector according to claim 1, wherein the foldable metal detector further comprises a tail cover; third threads are on the tail cover; the tail cover is fixedly connected to the tail end of the waterproof circuit protecting chamber through the third threads.

4. The foldable metal detector according to claim 3, wherein the tail cover comprises a connecting nut; the extending rod comprises a stud; the connecting nut is fixedly disposed in the tail cover; the stud is screwed into the connecting nut, so that the extending rod is fixedly connected with the waterproof circuit protecting chamber.

5. The foldable metal detector according to claim 1, wherein the circuit component further comprises a mounting board; the circuit board is fixedly disposed on the mounting board.

6. The foldable metal detector according to claim 5, wherein the circuit component further comprises an upper shell and a fixing shell; the fixing shell is fixedly connected with the upper shell and the mounting board.

7. The foldable metal detector according to claim 6, wherein the circuit component further comprises buttons; the buttons pass through the upper shell and are electrically connected with the circuit board.

8. The foldable metal detector according to claim 6, wherein button caps are disposed on the waterproof circuit protecting chamber; pressing sheets are disposed on the waterproof circuit protecting chamber; when the circuit component is fixedly disposed in the waterproof circuit protecting chamber, inner surfaces of the pressing sheets are attached to the buttons; the waterproof circuit protecting chamber wraps the circuit component; the button caps are attached to outer surfaces of the pressing sheets.

9. The foldable metal detector according to claim 8, wherein the circuit component further comprises a battery; the battery is electrically connected with the circuit board.

* * * * *